United States Patent
Miyazawa

(10) Patent No.: US 7,754,290 B2
(45) Date of Patent: Jul. 13, 2010

(54) METHOD OF FORMING FILM, PATTERNING AND METHOD OF MANUFACTURING ELECTRONIC DEVICE USING THEREOF

(75) Inventor: Takashi Miyazawa, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 372 days.

(21) Appl. No.: 11/459,793

(22) Filed: Jul. 25, 2006

(65) Prior Publication Data

US 2007/0020389 A1     Jan. 25, 2007

(30) Foreign Application Priority Data

Jul. 25, 2005 (JP) ............................ 2005-214099
Jul. 10, 2006 (JP) ............................ 2006-189687

(51) Int. Cl.
    *C23C 16/00*     (2006.01)
(52) U.S. Cl. .................................. 427/421.1; 427/248.1
(58) Field of Classification Search .............. 427/248.1, 427/255.7
    See application file for complete search history.

(56) References Cited

U.S. PATENT DOCUMENTS 5,330,936 A * 7/1994 Ishitani ..................... 438/791
5,766,342 A * 6/1998 Shibuya et al. ............... 117/54
6,342,277 B1 * 1/2002 Sherman ...................... 427/562
2002/0164423 A1 * 11/2002 Chiang et al. ............ 427/255.28
2003/0127127 A1 * 7/2003 Inamasu et al. ............. 136/255
2003/0166311 A1 * 9/2003 Miyazawa ................... 438/82

FOREIGN PATENT DOCUMENTS

JP     A-09-289337        11/1997
JP     A-2003-197531       7/2003
WO     WO 2003/026359 A1   3/2003

OTHER PUBLICATIONS

Akihiko Ishitani, "A model for SiNx CVD Film Growth Mechanism by Using SiH4 and NH3 Source Gases". Dec. 1990, Japanese Journal of Applied Physics, vol. 29, No. 12, L2322-L2325.*

* cited by examiner

*Primary Examiner*—Timothy H Meeks
*Assistant Examiner*—Nathan T Leong
(74) *Attorney, Agent, or Firm*—Oliff & Berridge, PLC

(57) ABSTRACT

A method of forming a film includes: disposing a plurality of films on a substrate by discharging a chemical species or a precursor material thereof from at least one nozzle, the plurality of films being made of the chemical species.

9 Claims, 4 Drawing Sheets

METHOD OF FORMING FILM, PATTERNING AND METHOD OF MANUFACTURING ELECTRONIC DEVICE USING THEREOF

BACKGROUND

1. Technical Field

An aspect of the present invention relates to a method of forming a film, patterning and method of manufacturing electronic device using these methods.

2. Related Art

In manufacturing electronic elements, silane that has a short chain length and danger of explosion was conventionally used. It has been necessary to improve costs and safety in this manufacturing thereby.

WO2003/026359 discloses a film formation apparatus so as to provide a new method of patterning with high degree of freedom in selecting materials. This film formation apparatus includes: a vacuum chamber capable of being adjusted at a predetermined degree of vacuum; a nozzle connected to a material supply source while being attached to the vacuum chamber so as to supply a material from the material supply source into the vacuum chamber; a substrate stage arranged in the vacuum chamber so as to hold and fix a substrate; and a movement mechanism for moving at least one of the nozzle and the substrate stage. The relative positions of the nozzle and the substrate stage can be controlled by the movement mechanism. Further, it discloses a method of free jet pattering by using this apparatus.

Further, JPA2003-197531 discloses a pattering apparatus so as to provide a new method of patterning with high degree of freedom in selecting materials. This pattering apparatus includes: a chemical species generation section that generates the chemical species from a material by irradiating laser light to the material, a nozzle that discharges the chemical species generated in the chemical species generation section, a movable mechanism that moves the relative positions of the nozzle and the substrate stage on which the chemical species is deposed. Further, it discloses a method of free jet pattering by using this apparatus.

Further, JPA9-289337 discloses a method of forming a film using silylene, such as forming a EL element in which poly-di-n-hexylpolysilylene (PDHS:—SiRR'; R=R'=$C_6H_{13}$) is used as a light emission layer.

SUMMARY

An aspect of the present invention is to provide a method of manufacturing a film by using a chemical species such as a reaction species. However, the invention includes various aspects more than this aspect. This method is useful to manufacture electronic elements and electronic devices.

According to one aspect of the invention, a method of forming a film includes: depositing a plurality of films on a substrate by discharging a chemical species or a precursor thereof from at least one nozzle.

The plurality of films may be made of the chemical species.

According to another aspect of the invention, a method of forming a film includes: discharging a chemical species that includes a reactive species from at least one nozzle, so that a film is formed by reaction of the chemical species on a substrate.

In this method of forming a film, "reaction of the chemical species" means 1) one case in which a chemical species reacts with another chemical species or 2) another case in which the chemical species reacts with other materials. As a typical example of a case 1), polymerization reaction is cited for example. As a typical example of a case 2), one case, in which the chemical species reacts with other materials in a gas phase, and is deposited on the substrate, and another case, in which the chemical species reacts with the surface of the substrate, are cited.

Further, the method may include the following features.

The at least one nozzle may be a plurality of nozzles. This feature is capable of discharging a plurality of materials simultaneously from more than two nozzles among a plurality of nozzles. Further, discharging the same material from different nozzles uniformizes or compensates variation of the amount of the material discharging from every nozzle. For example, when at least two nozzles among the plurality of nozzles discharge two different materials, it is possible to perform a kind of co-evaporation by adjusting the relative position of at least two nozzles. This adjustment makes two nozzles adjacent together, or gaseous materials discharged from the two nozzles spatially cross together or on the substrate on which a film is formed.

In the above method of forming a film of the invention, the chemical species may be formed by the reaction of the precursor material of the chemical species.

In the above method, the chemical species may be formed by cleaving al least one chemical bond among chemical bonds that are included in the precursor material of the chemical species.

In the above method of forming a film of the invention, the chemical species may be formed by changing the molecular structure of the precursor material with an rearrangement reaction. In the above method of forming a film of the invention, the chemical species may be formed by providing an energy to the precursor material.

As energy given to the precursor material for generating a chemical species, electromagnetic waves such as millimetric-wave, sub millimetric-wave, micro-wave, infrared ray, visible light wave, ultraviolet wave, or X ray and thermal energy are cited for example.

These electromagnetic waves are generated by common light sources, such as a mercury lamp, a zinc lamp, a xenon lamp, a halogen lamp, as well as lasers, such as an Nd:YAG laser, an excimer laser, an nitrogen laser, a $CO_2$ laser, a Titan:sapphire laser, and the like.

In the above method of forming a film of the invention, the chemical species may be reactive species. As the reactive species, a low-valent chemical species such as a radical, an ion radical, an ion, or a chemical species having unstable multiple bond such as silaethene and disilene, and chemical species having high degree of coordinate such as five-coordinate, or six coordinate silicate. Further, the chemical species may have high reactivity such as a 0 coordinate metal formed by reduction or the like.

In the above method of forming a film of the invention, the chemical species may be capable of polymerization.

In the above method of forming a film of the invention, the chemical species is formed by cleaving at least one chemical bond among chemical bonds that are included in the precursor material or transfer reaction. As described above, the chemical species, generated by cleaving chemical bonds that are included in the precursor material or a rearrangement reaction, has high reactivity so that it is possible to react with another species or other material.

In the above method, the chemical species may be a radical, an ion radical, an ion, or a low-valent chemical species.

In the above method, a free jet of the chemical species may be generated by discharging the chemical species from the nozzle. Using a free jet can constrain generation of heat, which is locally generated when chemical species or reactive species are landed on a substrate because becoming a state close to "cooled state". In the cooled state, energy levels of chemical species or reactive species included in a gaseous material discharged from a nozzle usually become the minimum level. These energy levels are electronic, vibrational and rotational. Therefore, circumferential effects can be reduced when a film is formed, easily making a fine film or a pattern be formed.

Further, if chemical species or reactive species become a state close to "cooled state", sub reaction from chemical species or reactive species can be constrained, making it possible to uniformize the structure or character of a film formed with chemical species or reactive species.

In the above method, the precursor may be a compound including a metal atom.

In the above method, the precursor may be a liquid silicon compound under normal temperature and pressure (25 degrees centigrade and 1 atm).

In the above method, the chemical species may be a silylene. A silicon film can be formed under a relatively mild condition using the silylene as the chemical species.

In the above method, the substrate may include a sub film, and at least one film of the plurality of films may be formed on the sub film that may include a bond that reacts with the chemical species. A reaction between the bond and the chemical species may an insertion reaction.

A thickness control can be attained at a molecular level since the aspect of the method uses a reaction on a molecular scale.

In the above method, the bond may include a Z—H group (where Z refers to chalcogen), or a Y—H group (where Y refers to elements in the group 14.)

According to a method of forming patterning of an aspect of the invention, it includes: depsoting a plurality of films on a substrate by discharging a chemical species or a precursor thereof from at least one nozzle, the plurality of films being made of the chemical species.

In another aspect of a method of forming patterning of the invention, it includes: discharging a chemical species that includes a reactive species from at least one nozzle, so that a plurality of films is formed by reaction of the chemical species on a substrate.

Further, the method may include the following features:

The at least one nozzle may be a plurality of nozzles. This feature is capable of discharging a plurality of materials simultaneously from more than two nozzles among a plurality of nozzles. Further, discharging the same material from different nozzles uniformizes or compensates variation of the amount of the material discharging from every nozzle of the plurality of nozzles.

In the above method, the precursor of the chemical species may be a compound including a metal atom.

In the above method, the precursor material of the chemical species may be a liquid silicon compound under an ordinary temperature and pressure (25 degrees centigrade and 1 atm).

In the above method, the chemical species may be a silylene. A silicon film can be formed using the silylene as the chemical species under a relatively mild condition.

In the above method, a plurality of film may be formed on a sub film. The sub film may have a structure including a bond reacting with the chemical species. A reaction between the bond and the chemical species may be an insertion reaction. A thickness control can be attained at a molecular level since the aspect of the method uses a reaction on a molecular scale.

In the above method, the bond may include a Z—H group (where Z refers to chalcogen), or a Y—H group (where Y refers to elements in the group 14.)

The present invention further includes a method of manufacturing an electronic device using the above method of forming a film.

The present invention further includes a method of manufacturing an electronic device using the above method of forming a pattern.

The above aspect of the invention can provide a method of simply forming a film or patterning by using a chemical species such as reactive species.

Further, the above aspect of the invention can be appropriate for cost reduction and safety in a method of forming a film or patterning that can be used for forming a silicon semiconductor film and the like and a method of manufacturing an electronic device using these methods.

The method of forming a film or patterning of the invention can be applied to a method of manufacturing LED arrays, TFTs, sensors and the like or electronic devices including them.

Further it is useful for a combinatorial process. Namely, a plurality of films can be formed in a plurality of regions on a substrate under different film forming conditions. For example, a plurality of films can be formed by adjusting pressure of carrier gas or reactive gas and depressurizing a chamber and the like.

DESCRIPTION OF EXEMPLARY EMBODIMENTS (Method of Forming a Film)

Embodiments of the invention for forming a film are explained.

First Embodiment

Figure 1:
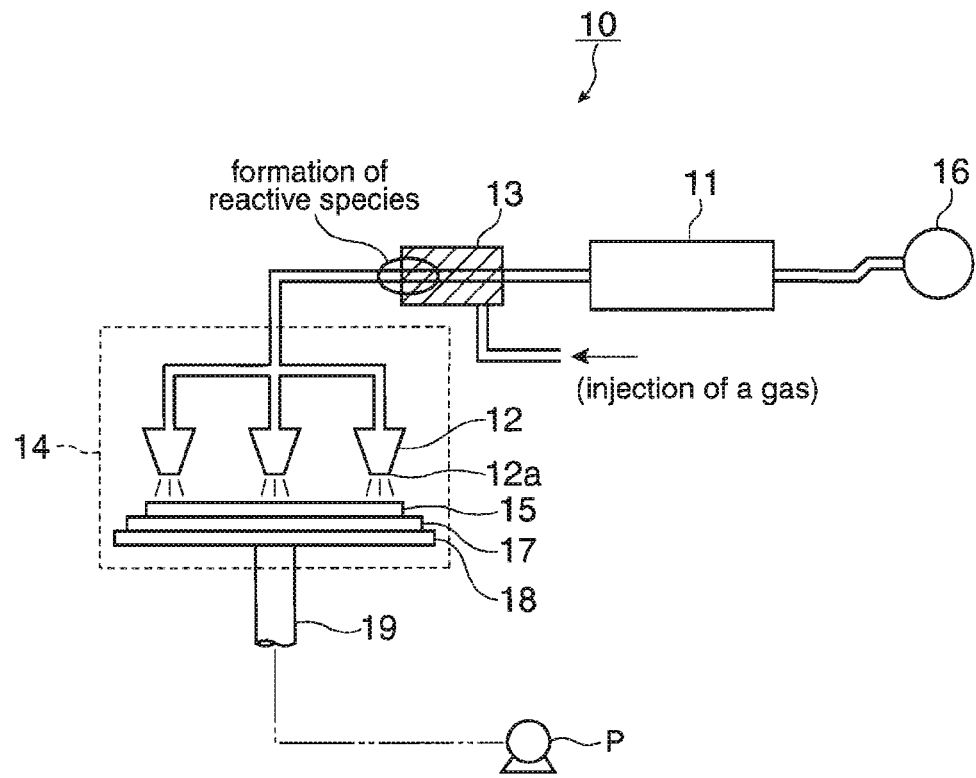
FIG. 1 is a schematic diagram illustrating a structure of the film forming apparatus that performs a method of forming a film according to the invention.

The embodiment is to provide a method of forming a film in which a plurality of films are disposed on a substrate by generating a desired chemical species such as a reactive species from the precursor materials of it with heating and using a plurality of nozzles, FIG. 1 is a schematic diagram illustrating a structure of a first embodiment of the film forming apparatus according to the invention. In FIG. 1, a film forming apparatus 10 according to the first embodiment includes a material reservoir 111 for retaining a material and a plurality of nozzles 12, provided downstream of the material reservoir 11 via a flow channel, for carrying out a discharge to form a film. In addition, between the material reservoir 11 and the plurality of nozzles 12 is provided a heating section 13 that functions as a chemical species generation section for generating a chemical species, such as a reactive species or the like, with the aforementioned material as a precursor material.

In addition, the film forming apparatus 10 further includes a chamber 14 that is configured to have arranged therein the plurality of nozzles 12, a substrate 15, on which a film is to be formed of the chemical species discharged from the nozzles 12, and a substrate stage 17 on which the substrate 15 is placed. The chamber 14 is connected to a vacuum device P via a pipe 19, and has a door (not shown) attached thereto in an airtight manner. The door is used to place the substrate stage 17 in an internal space of the chamber 14 and put the substrate 15 to be subjected to patterning in and out of the chamber 14.

Each nozzle 12 has a tip end at which a nozzle orifice 12a is formed, and the tip end is arranged inside the chamber 14. On the outside of the chamber 14, a rear end of the nozzle 12 is connected via the heating section 13 to the material reservoir 11, which functions as a supply source of the material. In addition, a carrier gas supply source 16 is connected to the material reservoir 11. The nozzle 12 is capable of discharging a gaseous material. In the case where the difference in pressure between the nozzle 12 and the chamber 14 is sufficiently large, the gaseous material discharged from the nozzle 12 will be in a state called a free jet or supersonic molecular jet or in a state resembling such a state. In the state called a free jet or supersonic molecular jet, the energy level, in terms of electrons, vibration, rotation, and the like of the chemical species or reactive species contained in the gaseous material discharged from the nozzle 12 is the lowest level, i.e., a so-called "cooled state". Therefore, it is possible to constrain generation of heat that may locally occur when the chemical species or reactive species reaches the substrate. This constraint reduces influence that may be exerted on an area around a location where the film is formed, making it easy to form a fine film or pattern.

Moreover, the reaction of the chemical species or reactive species under the cooled state occurs under the situation where there is insufficient excess energy. In the case when there is a plurality of reactive pathways, a sub reaction caused by the chemical species or reactive species may be constrained. Thus, it is also possible to make uniform a microstructure, or molecular or atomic structure and characteristics of the film formed of the chemical species or reactive species. A discharge mechanism (not shown) is provided at the tip end of the nozzle 12. To this discharge mechanism, various types of discharge mechanisms can be applicable. Examples of such applicable discharge mechanisms include mechanisms with common mechanical shutters and mechanisms of a discharge control type, a pressure vibration type, an electromechanical type (i.e., a so-called piezoelectric type), an electro thermal conversion type, an electrostatic attraction type, and the like.

The material reservoir 11 is used to store and to hold a precursor material of the chemical species that is used as the material for film formation or patterning. For example, it stores a precursor material for forming a luminescent layer, electron transport layer, positive hole transport layer, or the like of a semiconductor element such as a transistor, a light-emitting diode, an organic electroluminescent element, or the like such that the material is held by a holder (not shown) such as a cell, a crucible, or the like.

The heating section 13 provided between the material reservoir 11 and the plurality of nozzles 12 functions as the chemical species generation section for generating the chemical species from the material as the precursor material held within the material reservoir 11 as the precursor, for example. In other words, the material carried by a carrier gas from the carrier gas supply source 16 causes generation of the chemical species by the action of the heating section 13. Therefore, it is preferable that the temperature of the heating section 13 be set in a temperature range that allows the generation of the chemical species from the material as the precursor material, and can be adjusted as necessary in accordance with the type of the material used. The temperature range for generating the chemical species depends on the chemical species to be generated or the precursor material to be used. But, typical range is from 100 to 500 degrees centigrade. In the case when the chemical species, which is easily handled under normal temperature, is efficiently generated, the preferable range is 150 to 300 degrees centigrade.

Various types of heaters can be applicable to the heating section 13 as long as they are capable of generating the chemical species from the precursor material. Examples of such applicable heaters include a radiant tube heater, a sheath (pipe) heater, a plug heater, a flange heater, a finned heater, a cartridge heater, a micro heater, a cast heater, a hand heater, a plate heater, a block heater, a quartz heater, a silicon rubber heater, a ribbon heater, a carbon heater, an Ni—Cr heating element, an Fe—Cr heating element, an SiC heating element, and the like. The sheath (pipe) heater is formed by placing a heating wire (an Nichrome wire, an iron-chromium wire, or the like) in a metal pipe (i.e., a sheath) using magnesia for an insulating material and increasing a filling density by a drawing process in order to allow heat from the heating wire to easily transmit to a surface of the metal pipe.

Heaters with an electromagnetic wave generator that generates a high frequency wave, a microwave, or the like are also applicable to the heating section 13. In addition, a gas may be introduced into the heating section 13 as necessary. Such gas is a reactive gas such as oxygen, chlorine, fluorine, or the like, or an inert gas such as argon, helium, nitrogen, or the like. A method of heating employed in the heating section 13 is selected appropriately considering physical factors such as the boiling point and melting point of the material used, and the like, chemical factors such as a reaction mode, and the like., the type and amount of the chemical species to be generated, and the like.

In addition, a catalyst or the like may be provided inside the heating section 13 in order to accelerate the generation of the chemical species or adjust generation efficiency, a reaction temperature, or the like.

The relationship between the heating section 13, which functions as the chemical species generation section and the plurality of nozzles 12, is as follows. The plurality of nozzles 12 are provided on a discharge head (not shown.) The discharge head is connected to the heating section 13 and is so constructed that the chemical species generated in the heating section 13 and supplied from the heating section 13 is separated into a plurality of channels within the discharge head and transmitted to each of the nozzles 12. Alternatively, the discharge head may be connected to the heating section 13 and be so constructed that the chemical species generated in the heating section 13 and supplied from the heating section 13 is separated into a plurality of channels before reaching the discharge head and thus transmitted to each of the nozzles 12 without the channel separation within the discharge head. In this case, it is possible to eliminate unevenness in energy loss due to the channel separation within the nozzles and allow the supply of the chemical species to be performed more evenly.

A mechanism for emitting the chemical species heats the material supplied into the heating section 13, and thereby generates the chemical species from the material and emits the chemical species from the heating section 13. This discharge mechanism includes a heating unit for heating the material inside the heating section 13, which functions as the chemical species generation section, and is configured to control the timing of heating in order to control the timing of the discharge of the chemical species. Examples of the heating unit for discharging the chemical species include those using an electric heater, lasers such as an nitrogen laser, a YAG laser, and the like, a high-frequency heater, and the like. Note that the heating unit is not limited to these examples, but various known heaters are applicable thereto. In the case where the heating section 13 heats the material to generate and discharge the chemical species, it is preferable that the heating unit be provided so as to heat the material or the chemical species located close to a surface of the heating section 13 that faces the substrate 15. Thus, it becomes possible to allow the chemical species to effectively be formed as a film.

The carrier gas supply source 16 carries the material to the material reservoir 11 using generally an inert gas, such as helium, argon, nitrogen, or the like, as the carrier gas. Depending on the type of the material, a reactive gas, such as oxygen ($O_2$), chorine, fluorine or the like, that reacts with the material may be used as the carrier gas to carry the material to the material reservoir 11. The carrier gas carried to the material reservoir 11 accompanies and carries the precursor material from the material reservoir 11 to the heating section 13, and further accompanies and carries the chemical species generated from the material within the heating section 13 to the plurality of nozzles 12. Depending on the type of the discharge mechanism of the nozzles 12, the material may be discharged into the chamber 14 without using the carrier gas from the carrier gas supply source 16.

The pressure within the chamber 14 can be set properly in accordance with various conditions, such as patterning precision, deposition rate, types of the material and its precursor, and the like, but in the present embodiment, the pressure is set as a vacuum atmosphere. Making the inside of the chamber 14 a high vacuum allows the gaseous material discharged from the nozzles 12 to be in the free jet or supersonic molecular jet or in a state resembling it as described above, providing an advantage in forming a fine pattern or film.

In the case where the chamber 14 is provided with a vacuum atmosphere, the chamber 14 may be connected via the pipe 19 to the vacuum device P, such as a pump or the like, to provide the vacuum atmosphere, and may have the door (not shown) attached thereto in an airtight manner. The door is used to place the substrate 15 in the internal space of the chamber 14 and put the substrate 15 to be subjected to patterning in and out of the chamber 14. The vacuum device P adjusts the inside of the chamber 14 at a high degree of vacuum by the combination of a turbo-molecular pump, a rotary pump, and the like. In this case, one end of the pipe 19 that connects the vacuum device P and the chamber 14 is opened within the chamber 14, and thus an operation of the vacuum device P, which will be described below, is able to evacuate the chamber 14 to provide a high vacuum atmosphere.

When providing the vacuum atmosphere within the chamber 14, the vacuum device P can be used to adjust the degree of vacuum within the chamber 14. The inside of the chamber 14 is adjusted at a high vacuum atmosphere of preferably $10^{-3}$ torr ($1.33322 \times 10^{-1}$ Pa) or less, and more preferably, $10^{-5}$ torr ($1.33322 \times 10^{-3}$ Pa) or less.

If a vacuum atmosphere of $10^{-3}$ torr or less is provided, the material which is uneasily discharged, can be easily discharged and in addition, if a vacuum atmosphere of $10^{-5}$ torr or less is provided, still more sorts of materials can be easily discharged and it becomes easy to vaporize the material discharged and turn it into a molecular beam.

Note that in the case where the above-described vacuum device P is used, in order to prevent vibration of the pump that forms part of the device from propagating into the chamber 14, it is preferable that the pump be placed so as to be sufficiently distant from the chamber 14, or that the pump or the like additionally have a vibration isolation function.

Alternatively, the inside of the chamber 14 may be provided with an inert gas atmosphere. In this case, an atmosphere of helium, argon, nitrogen, or the like, i.e., the same inert gas used as the carrier gas, is preferable.

The substrate stage 17 is arranged directly below the nozzle orifice 12a and holds and secures the substrate 15 used for manufacturing an electro-optical device, for example. The substrate stage 17 is provided with a movement mechanism 18 that enables the substrate 15 held and secured on the stage to move in X, Y, and Z directions relative to the nozzle orifice 12a. Specifically, the movement mechanism 18 is provided with a Z movement portion (not shown) that is capable of moving and positioning the substrate 15 in a vertical direction (i.e., the Z direction) relative to the nozzle orifice 12a to adjust the distance between the substrate 15 and the nozzle orifice 12a, and an X movement portion (not shown) and a Y movement portion (not shown) that are capable of moving and positioning the substrate stage 17 in horizontal directions (i.e., the X direction and the Y direction, respectively) relative to the nozzle orifice 12a. The movement mechanism 18 is configured to be capable of controlling an operation of each of these moving portions in accordance with a setting of a control section (not shown). The X movement portion, the Y movement portion, and the Z movement portion are formed by linear motors, for example.

In addition, a temperature adjustment means (not shown) of a water-cooled type or the like is provided on a mounting surface of the substrate stage 17. This adjusts the temperature of the substrate 15 on the substrate stage 17 so that the substrate 15 has a desired temperature.

Since the film forming apparatus according to the present embodiment has the above-described mechanism for changing the relative position between the nozzle 12 and the substrate stage 17 or the substrate 15, it is possible to control the distance between the substrate 15 (or the substrate stage 17) and the nozzle 12 and provide a mechanism for scanning. This mechanism makes it possible to set a plurality of relative positions between the nozzles 12 and the substrate stage 17, and allow the nozzles 12 in their respective positions set to discharge the chemical species to form a plurality of films.

Differently from a usual mask patterning, when patterning is performed while the nozzle which discharges a material is moved as in the embodiment of the invention, a distance between a substrate on which the material is arranged and the nozzle can be maintained uniformly. Further, the embodiment can be applied to a large area substrate since there is no bending of a mask.

Further, one continuous film can be formed by using the foregoing mechanism. In this case, a distance between each section of the one continuous film and the nozzle can be constant. Therefore, variations in a film thickness according to sections of the one continuous film can be reduced.

In some cases, by setting the pressure of the chamber 14 sufficiently lower compared to the pressure in the nozzle, it becomes unnecessary to particularly provide a piezo device for the nozzle. When the piezo device is not used, the nozzle is not particularly limited by a piezoelectric device composing the piezo device, and thus the pitch of the nozzle can be small. Therefore, compared to in a usual inkjet method or the like, finer direct lithography can be performed.

When patterning is performed while a nozzle which discharges a material is moved as in the embodiment of the invention, patterning may be performed by using a mask. In this case, compared to the case not using a mask, it is advantageous that, for example, a film having a desired shape can be formed by utilizing a mask having a pattern with a desired shape such as a quadrangle and a circle.

Other Embodiment

As other illustrative embodiment of the invention, the following film forming method can be provided. Namely, chemical species from a material compound composed of a chemical species precursor such as reaction active species is generated by electromagnetic wave and a plurality of films are deposited by utilizing a plurality of nozzles. In this film forming method, a film forming apparatus having a structure fundamentally similar to that of the film forming apparatus 10 of the first embodiment is used, except that the foregoing heating section 13 in the first embodiment is changed to an optical window capable of transmitting electromagnetic wave and the like or a part to introduce electromagnetic wave and the like. As electromagnetic wave, it is needless to say that an usual light source such as a mercury lamp, a zinc lamp, a xenon lamp, and a halogen lamp can be cited. In addition, a laser such as an Nd: YAG laser, a nitrogen laser, an excimer laser, a $CO_2$ laser, and a titanium sapphire laser can be also cited. As a part which generates chemical species, for example, millimetric wave, microwave, infrared light, visible light, ultraviolet light, vacuum ultraviolet, or X ray can be used as electromagnetic wave to generate chemical species. Further, electromagnetic wave instead of general light can be utilized to generate chemical species or to make the chemical species in a gaseous state. For example, chemical species such as plasma may be generated by microwave, radio wave or the like.

In the film forming method of the foregoing embodiment utilizing electromagnetic wave, a film forming apparatus having a structure similar to that of the film forming apparatus of the foregoing embodiment can be used except that the position of the optical window as a chemical species generating part is changed to a position downstream from the plurality of nozzles (downstream of material flow.) Namely, the exception is that the position of the optical window is changed to a position between the plurality of nozzles and the base. To obtain a fine pattern by using the film forming apparatus, it is necessary that the nozzle be approximated to the base. Therefore, when a light is transmitted between the nozzle and the base as described above, it is preferable to attain precise optical alignment.

According to this embodiment, a film forming method and a patterning method which can be utilized for a manufacturing method of a silicon semiconductor film or the like which are suitable for reducing the cost and safety risk can be provided.

Further, chemical species generated in this embodiment can be discharged from at least one nozzle as, for example, a gaseous material.

When a direct lithographic patterning is performed by using the gaseous material, processes such as photolithography can be omitted, and thus manufacturing steps can be shortened.

In the film forming method according to the embodiments of the invention, chemical species are generated by heat, light, or electromagnetic wave, and the chemical species are discharged from the plurality of nozzles, forming a plurality of films in block. "In block" herein may mean discharging the chemical species concurrently, or sequential discharging by shifting discharging time every nozzle.

According to the method of pattering of the invention, a fine patterning, which is favorable for wiring in a circuit, can be performed.

The film forming method according to the embodiments of the invention can be applied to forming various films of an insulating body, a semiconductor, a conductor, a superconductor or the like.

The film forming method according to the embodiments of the invention is effective in combinatorial processes as well. That is, it is possible to form a plurality of films formed under different film forming conditions in a plurality of regions on a base. For example, by adjusting conditions such as a pressure of carrier gas and reactive gas and a depressurization degree of a chamber, a plurality of films can be formed.

Figure 3:
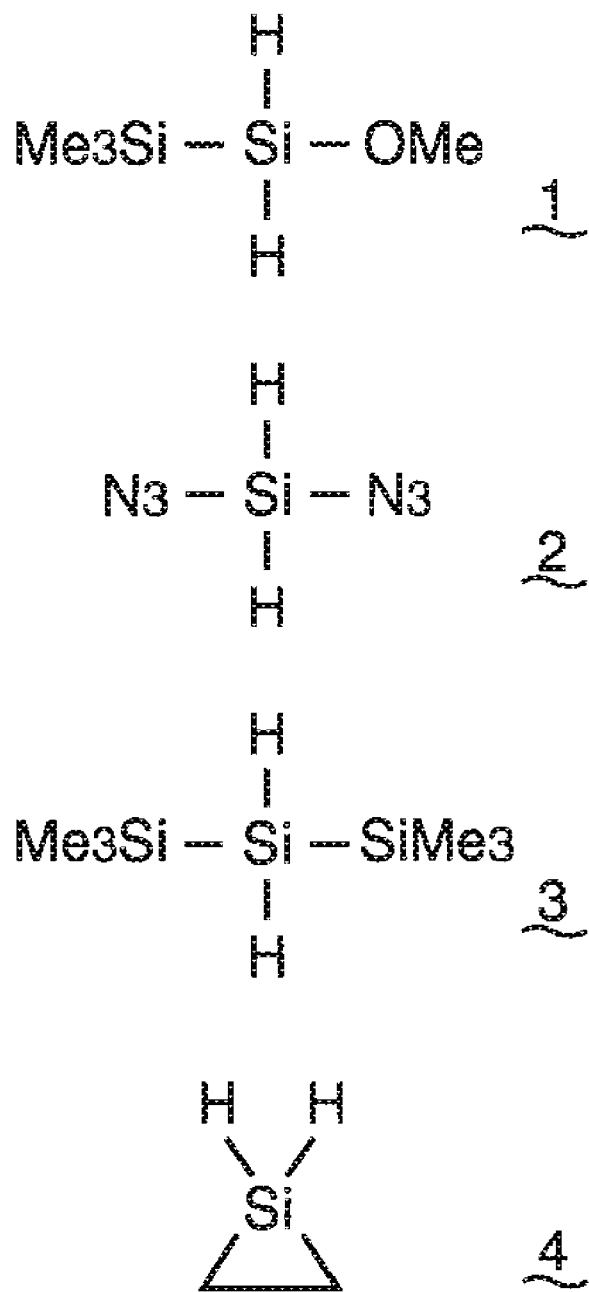
FIG. 3 shows a structural formula for a material (a chemical species precursor), which is used for a method of forming a film of the invention.

Examples of materials that can be used as the precursor of the chemical species used in the film forming apparatus according to the invention include: compounds with an organic group, such as dialkylzinc ($ZnR_2$), trimethyl gallium ($Me_3Ga$), tetramethylsilane ($Me_4Si$), trimethylarsine ($Me_3As$), tetrakis (dimethylamide) zirconium, and the like; compounds containing metal, such as tantalum pentachloride, tungsten hexacarbonyl ($W(CO)_6$), and the like; compounds with substituents other than the organic group or a ligand, such as phosphine, and the like; and simple substances, such as red phosphorus, yellow phosphorus, and the like. At room temperature and atmospheric pressure (25° C., 1 atm), liquid silicon compounds (e.g., silicon compounds 1 to 4 as illustrated in FIG. 3) or the like can be cited. In particular, the silicon compounds 1 to 4 are preferable as they involve a relatively low risk of ignition, explosion, and the like, and are thus easy to handle. In the case where the silicon compound 3 or 4 is used, it is preferable that a chemical species, such as a reactive species, be generated by light having a wavelength of approximately 200 nm. The dialkylzinc ($ZnR_2$), which can be used as the precursor material of ZnO, is preferable in that it is easy to evaporate and easy to be decomposed to a desired degree.

For the precursor material, materials that generate the chemical species by cutting at least one of their chemical bonds or by transfer reaction are preferable. For the material so as to generate the chemical species, precursor materials that are capable of generating a reactive species, such as a radical, an ion radical, an ion, a low-valent chemical species (e.g., carbene, silylene, and the like), or the like as the chemical species are preferable. Also preferable for the material are precursor materials that are capable of generating a chemical species capable of polymerization.

For example, it is possible to form a silicon film by carrying silylene generated by heating a precursor material of silylene that is a divalent silicon species to the plurality of nozzles and discharging it. Silicon compounds heretofore used in a liquid-phase or vapor-phase process contain a large amount of hydrogen, and therefore they involve a risk of ignition, explosion, and the like. In the case where the compound 1 or 3 as illustrated in FIG. 3 is used as the precursor material of silylene in particular, there is an advantage in ease of handling as compared with the case of such risky silicon compounds.

Examples of the reactive species as the chemical species generated from the precursor material include: unstable chemical species, such as a radical, an ion, a radical ion, silaethene, silylyne, disilene, digermene, and the like, low-valent chemical species, such as carbene, silylene, and the like. The term "unstable chemical species" used herein refers to a chemical species that is thermodynamically or kinetically unstable, for example. That is, the term also refers to a chemical species that will easily exceed activation potential to be converted into a different compound. The term also refers to a chemical species that will easily react with another reactive agent and the like.

With a chemical species that is capable of polymerization in particular, such polymerization can be performed on the substrate, making it easy to form a film of macromolecules or form a macrostructure on the substrate.

Examples of the chemical species that are capable of polymerization include unstable chemical species, such as silaethene, silylyne, disilene, digermene, and the like, a low-valent chemical species, such as carbene, silylene, and the like.

In particular, the chemical species such as silylyne, disilene are used as an effective key intermediate material for polysilylene or poly-silane in which silicon atoms are connected together.

Figure 2:
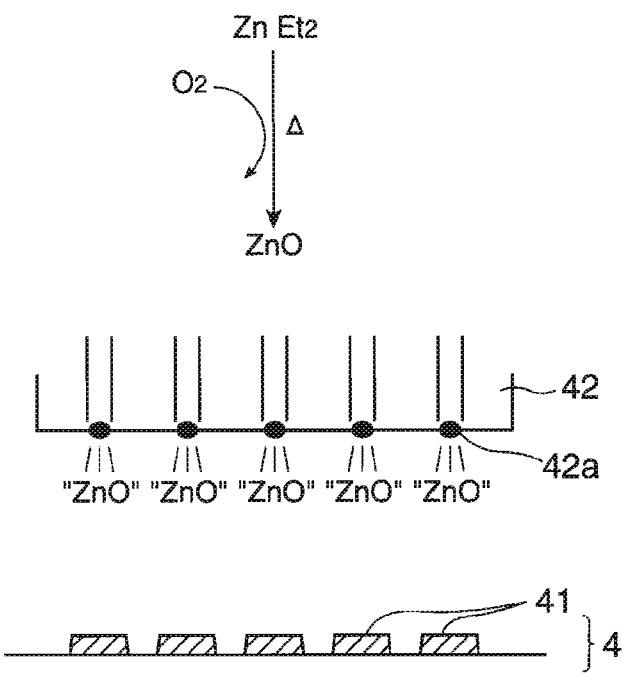
FIG. 2 is a schematic diagram illustrating an example of forming a film (a material: $ZnEt_2$) by using a method of firming a film in the first embodiment.

FIG. 2 is a schematic diagram illustrating the case where a film is formed based on the first embodiment by the film forming apparatus 10 with diethyl zinc ($ZnEt_2$) for the material. Oxygen ($O_2$) is used as the carrier gas. $ZnEt_2$, which has been contained and held in the material reservoir 11, is accompanied and carried by the carrier gas supplied from the carrier gas supply source 16 to the heating section 13. Then, heating at the heating section 13 causes $ZnEt_2$ to react with $O_2$, resulting in ZnO as the chemical species. Thereafter, ZnO is discharged from the nozzle orifice 42a of the nozzle 42, and thus, a luminescent layer 41 in an LED array 40 can be formed in an array, for example.

Next, applying a process for forming a film described above to a direct lithographic patterning in the manufacturing a TFT is explained.

FIGS. 4A to 4D are schematic process diagrams illustrating processes in a direct lithographic patterning of silicon using an insertion reaction of silylene according to an aspect of the invention. FIGS. 5A to 5C are schematic process diagrams illustrating processes for manufacturing the TFT after films are formed using the method of forming a film according to the aspect of the invention.

Figure 4A:
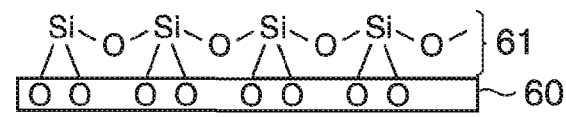
FIGS. 4A to 4D are schematic process diagrams illustrating processes in direct patterning of silicon for inserting silylene using a method of forming a film according to the invention.

A glass substrate 60 on which a sub film 61 made of Si—O has been previously provided is prepared (see FIG. 4A). Aqueous sodium hydroxide, aqueous nitric acid, and acetone are caused to act with the sub film 61 to provide hydroxyl groups on a surface of the sub film 61 (see FIG. 4B).

Figure 4B:
Figure 4C:
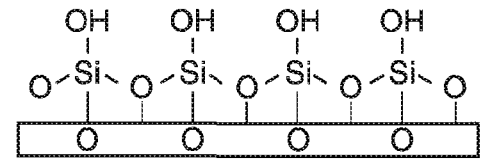
Figure 4D:
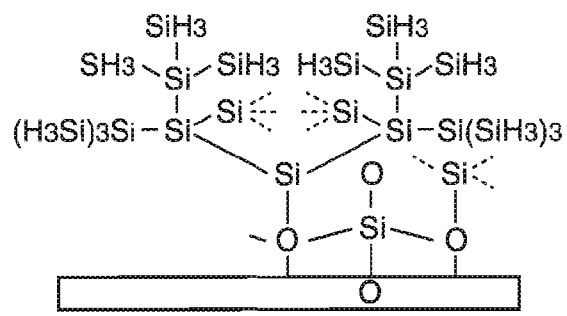
Figure 5A:
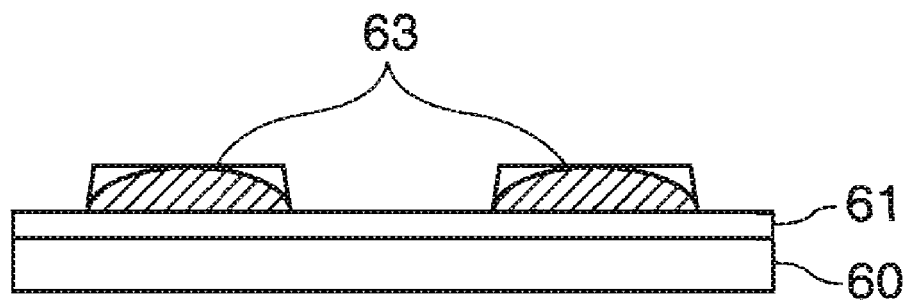
FIGS. 5A to 5C are schematic process diagrams illustrating processes for manufacturing the TFT after films are formed using the method of forming a film according to the invention.
Figure 5B:
Figure 5B:
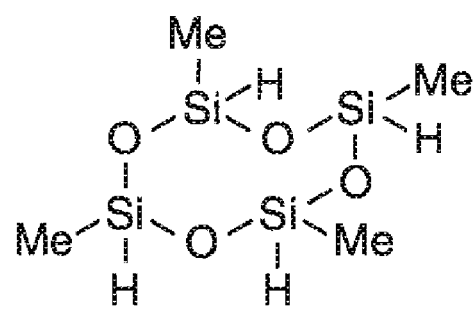
Figure 5B:
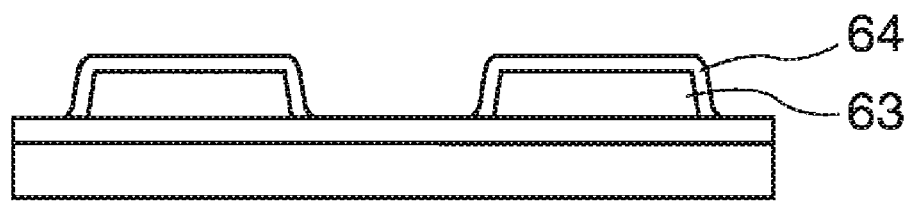
Figure 5C:
Figure 5C:
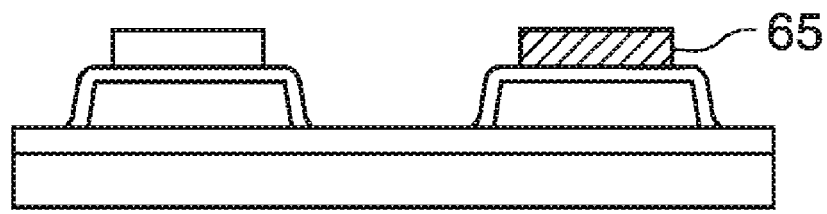

Next, silylene is introduced on the surface of the sub film 61 on the substrate in a state as illustrated in FIG. 4B (see FIG. 4C). At this time, based on the method of forming a film according to the invention, one of the silicon compounds 1 to 4 is used as the material, and the material is accompanied and carried downstream (i.e., in the direction of nozzles) by the carrier gas via the flow channel, for example. Next, in the chemical species generation section provided upstream of a plurality of nozzles 62, silylene (:$SiH_2$), which is the chemical species, is generated from the material by the action of heat, light, or the like. This silylene is discharged from the plurality of nozzles 62 so that the silylene reacts with the hydroxyl groups included in the sub film and Si—O bond is formed and an Si—H bond is regenerated at the end thereby. The Si—H bond further reacts with newly supplied silylene so that a film is formed. (See FIGS. 4C and 4D)

Namely, when performing insertion reaction of silylene, a compound including bonds with which silylene performs insertion reaction is preferable as a sub film. Examples of bonds with which silylene performs insertion reaction include a Z—H group (where Z refers to chalcogen), such as the O—H group as illustrated in the above example, and the like, a Y—H group (where Y refers to elements in the group 14), and the like Thereafter, heat annealing or the like may be carried out for crystallization or poly crystallization as necessary.

A plurality of silicon semiconductor films 63 are formed on the sub film 61 deposited on the glass substrate 60 by the above mentioned film forming method (FIG. 5A.) Next, $SiO_2$ is deposited on the silicon semiconductor films 63 by CVD using a predetermined silicon compound to form gate insulating films 64 (see FIG. 5B.) Further, on each of the gate insulating films 64, a gate electrode 65 is formed (see FIG. 5C). After that, common known processes for manufacturing a transistor are performed to obtain the TFT.

$AlMe_3$, which is relatively easy to be decomposed by heat, may be used as a CVD material to form the gate electrode 65. Note that in the processes for manufacturing the TFT, Al generated by irradiating aluminum metal with laser beams may be deposited, as described in JP-A-2003-197531. In the formation of the films, it is possible to set the size of the films by setting the distance between the nozzles and the substrate properly.

The invention has been described in detail above with reference to the preferred embodiments. However, needless to say, the invention is not limited to those embodiments in any respect.

For example, the substrate may be a glass substrate as described in the above-described embodiments, or alternatively may be an active matrix substrate, or the like (Patterning Method)

The method of patterning according to the invention is to deposit a plurality of films by generating a chemical species from a material compound composed of chemical species precursor and utilizing a plurality of nozzles.

The above mentioned method of forming a film is also applied as the preferable embodiment of method of patterning according to the invention. Hence, the above mentioned details for forming a film can be applied to the method of pattering of the invention. According to the method of pattering of the invention, a fine patterning, which is favorable for wiring in a circuit, can be performed.

(Method of Manufacturing Electronic Device)

The above mentioned method of forming a film or patterning is also applied to the method of manufacturing electronic device according to the invention. The present invention can offer an electronic device provided with a silicon semiconductor film manufactured with reduced cost and safety, more particularly, LED arrays, TFTs, sensors and electronic devices provided with them.

The invention has an advantage in industry as a method of simply forming a film or pattering by utilizing chemical species such as reactive species and the like. Further, the invention has industrial utility as a method of forming a film or pattering that can be applied to a method of manufacturing a silicon semiconductor film and a method of manufacturing LED arrays, TFTs, sensors and electronic devices provided with them.

What is claimed is:

1. A method of forming a film comprising:
   providing a base member, a first material being disposed on the base member, the first material including a first atom;
   discharging a chemical species on the first material, the chemical species including a second atom, the second atom bonding to the first atom through a first chemical bond; and discharging the chemical species on the second atom, the chemical species including a third atom, the third atom bonding to the second atom through a second chemical bond, wherein the second atom and the third atom are the same, and wherein, the first atom is an oxygen. the second atom is a silicon and the third atom is a silicon.

2. The method according to claim 1, the chemical species being a radical, a radical ion, an ion, a low-valent-chemical species or a reactive species that is generated by a fission of a third chemical bond of a first precursor or a rearrangement reaction of a second precursor.

3. A method of manufacturing an electronic device using the method according to claim 1.

4. The method according to claim 1, the chemical species being a carbene or a silylene.

5. The method according to claim 1, the first material being formed by polymerization of the chemical species.

6. The method according to claim 1, the chemical species being discharged from a nozzle.

7. The method according to claim 6, the chemical species being discharged from the nozzle such that a free jet of the chemical species is generated.

8. A method of forming a silicon film comprising:

providing a base member, a first material being disposed on the base member, the first material including an oxygen atom;

discharging a first silylene on the first material, a first silicon atom of the first silylene bonding to the oxygen atom through a Si—O chemical bond; and discharging a second silylene on the first silicon atom, a second silicon atom bonding to the first silicon atom through a Si—Si chemical bond.

9. A method of manufacturing an electronic device using the method according to claim 8.

* * * * *